PARAMETRIC AMPLIFIER WITH LOWER FREQUENCY PUMPING

Filed May 20, 1958

INVENTORS
STANLEY BLOOM &
KERN K.N. CHANG
BY
Charles H. Brown
ATTORNEY

United States Patent Office 3,018,443
Patented Jan. 23, 1962

3,018,443

PARAMETRIC AMPLIFIER WITH LOWER FREQUENCY PUMPING

Stanley Bloom, Plainfield, and Kern K. N. Chang, Princeton, N.J., assignors to Radio Corporation of America, a corporation of Delaware Filed May 20, 1958, Ser. No. 736,573
5 Claims. (Cl. 330—5)

The invention relates to an amplifier or generator of radio frequency energy, and particularly to such an amplifier or generator using a material, such as a solid state material, having a non-linear reactance characteristic.

Recent research of solid state materials having a nonlinear reactance characteristic, such as the germanium of a junction diode, has revealed that such materials can provide amplification of radio frequency energy. Amplifiers which make use of this characteristic are generally known as parametric amplifiers. While such parametric amplifiers provide means for amplifying microwave radio frequency energy, they have previously required a single pumping or external radio frequency energy source that has a frequency which is higher than the frequency of the signal which is to be amplified. Although a single pumping source is desirable, the problems presented by the requirement of higher frequency pumping energy are immediately obvious. For example, if a 4500 megacycle signal were to be amplified, the pumping energy would have to have a frequency higher than 4500 megacycles, for example 9000 megacycles. With some exceptions, it is generally more difficult to produce a given amount of radio frequency power as the frequency is increased upward from a frequency in the region of the UHF (ultra high frequency) band. Consequently, where the signal frequency must be amplified by a pumping source having a frequency higher than the signal frequency, it may be difficult and inefficient to provide sufficient power at the higher pumping frequency.

An object of the invention is to provide an improved device for amplifying or generating radio frequency energy in the order of 300 megacycles or higher.

Another object is to amplify or generate radio frequency energy with a nonlinear reactance material and with one or more pumping sources each of which has a frequency lower than the frequency of the energy to be amplified or produced.

The present invention provides a novel device for amplifying or generating radio frequencies in the order of several hundred megacycles or higher. Briefly, the invention comprises a material having a nonlinear reactance characteristic of the third order or greater. Means are coupled to the nonlinear element for applying a number of effective sources of radio frequency energy to the nonlinear element, the number of effective sources being one less than the order of the nonlinear characteristic of the nonlinear element. The frequency of each of the sources is less than the frequency to be amplified or generated by the device. An idling resonant circuit is also coupled to the nonlinear element. Output means are coupled to the nonlinear element for deriving amplified or generated radio frequency energy from the nonlinear element. If no external signal to be amplified is applied to the nonlinear element, then the device may function as a radio frequency generator. However, if an external radio frequency signal is applied to the nonlinear element, then the device functions as a radio frequency amplifier.

The invention is explained in detail in connection with the accompanying drawing, in which.

Figure 1:
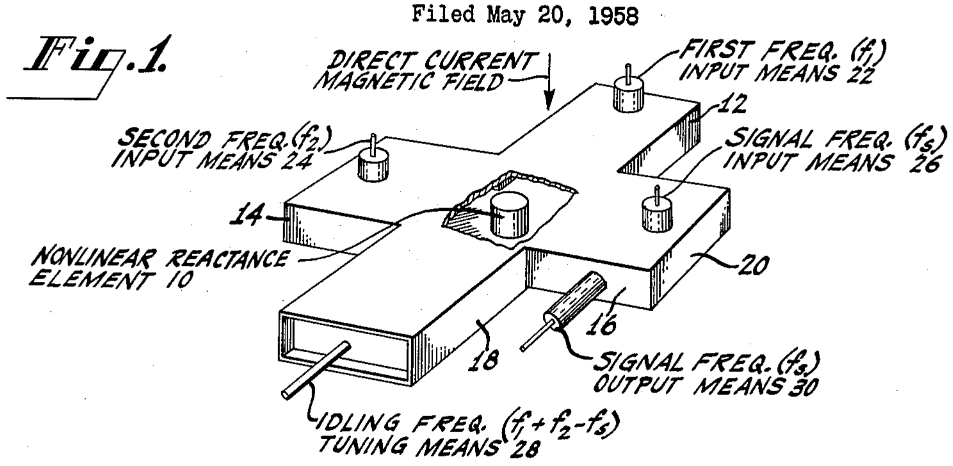
FIGURE 1 shows an amplifier in accordance with the invention that has two input means for applying external sources of radio frequency energy, an idling resonant circuit, and signal frequency input and output means.

The theory and principle by which solid state materials provide amplification have been discussed by various authors. For example, see "New Approaches to the Amplification of Microwaves" by James P. Wittke, RCA Review, Volume XVIII, No. 4, page 441, December 1957, and "Some General Properties of Nonlinear Elements" by J. M. Manley and H. E. Rowe, Proceedings of the I.R.E., Volume 44, page 904, July 1956. Generally, it has been found that certain solid state materials may be satisfactorily used in solid state parametric amplifiers. These materials may be grouped into two classes. The first class includes those materials which have a nonlinear capacitive reactance. Examples of such materials are the germanium or silicon in a junction diode. The second class of materials includes those which have a nonlinear inductive reactance. Examples of such materials are yttrium-iron garnet, gadolinium-iron garnet, and nickel-manganese ferrite having the composition $$Fe_{1.92}(NiMn_{.08})O_4$$

Either class of materials can be used, the class chosen being determined by the particular requirements of the circuit. Generally, it is desirable that the materials have as high an order of nonlinear reactance as obtainable, and as little resistance loss as possible so as to provide as much power gain as possible, as contrasted to the conventional vacuum tube and other detectors which have a nonlinear resistance characteristic. For the purposes of explanation of this invention, the particular order of nonlinear characteristic means that the magnetic flux linkage through an inductive reactor varies as the $n$th power of the flow of current, or the electric charge on a capacitive reactor varies as the $n$th power of the applied voltage, where $n$ is the order of nonlinearity. At the present time, those materials having at least a third order nonlinear reactance characteristic, regardless of the class, are required in the practice of the present invention. The required composition of materials having at least a third order nonlinear reactance characteristic are known to engineers in the physical and chemical fields. The main problem of producing such materials, however, seems to be one of technique and process. But regardless of the manner in which the materials are produced, any materials having at least a third order nonlinear reactance characteristic can be used in the practice of the present invention. Materials which are known to provide a nonlinear inductive reactance are those materials in the ferrite group. The magnetization nonlinear reactance characteristic of these materials can be used up to frequencics around 50 megacycles, the exact frequency being determined by the particular composition of the material. Above approximately 50 megacycles, the magnetic spin resonance of the material is used to provide the nonlinear reactance characteristic. In this case, a direct current magnetic field should be applied to the material so as to excite this magnetic spin resonance.

The amplifier shown in FIGURE 1 comprises a nonlinear reactance element 10 which may be any one of the materials listed above and which have a nonlinear reactance characteristic of at least the third order. The nonlinear element 10 is positioned at the intersection of four waveguides 12, 14, 16, 18 so that it is coupled to each of these waveguides. The physical dimensions of the nonlinear element 10 are not critical, and may be of any convenient size and shape. A cylinder having a length equal to the length of the narrow wall of the waveguides is convenient, as it can be easily mounted between the wide waveguide walls. The diameter of this cylinder might conveniently be one-tenth of the wavelength of the frequency to be amplified. Input means 22, such as a coaxial transmission line, is coupled to the first waveguide 12 so that energy applied to the first input means 22 is coupled to the first waveguide 12. This coupling may be accomplished by extending the inner conductor of the coaxial transmission line into the waveguide to form a probe. Similarly, second input means 24, such as a coaxial transmission line, is coupled to the second waveguide 14. Thus, the first and second input means 22, 24 are effectively coupled to the nonlinear element 10. A first pump or source of radio frequency energy (not shown) having a frequency $f1$ is applied to the first input means 22, and a second pump or source of radio frequency energy (not shown) having a frequency $f2$ is applied to the second input means 24. Signal input means 26, such as a coaxial transmission line, is coupled to the third waveguide 16 in the same manner as the first and second input means 22, 24 for supplying a signal of frequency $f_s$ that is to be amplified. The lengths of the three waveguides 12, 14, 16 are not critical, and may be any convenient dimension. It is preferable that tuning elements be added to the waveguides, if needed, to eliminate any reactive impedance which may be presented by the waveguides. Such tuning elements are not shown. In addition, each of the three waveguides 12, 14, 16 is preferably provided with a suitable terminating means at the ends of the three waveguides 12, 14, 16 remote from the nonlinear reactance element 10. In FIGURE 1, each of the three waveguides 12, 14, 16, is provided with a short-circuiting plate 20 which is positioned substantially a quarter wavelength from its respective coaxial line probe at the frequency of the energy in the respective waveguide. The fourth waveguide 18 is provided with tuning means 28. The tuning means 28 may be an adjusted plunger which, as shown in FIGURE 1, comprises a movable short-circuiting plate that permits the effective length, and hence resonant frequency, of the fourth waveguide 18 to be changed.

A radio frequency signal to be amplified and having a frequency $f_s$ is applied to the signal frequency input means 26. Each of the source frequencies ($f1$ and $f2$) is less than the signal frequency $f_s$. With the source frequencies $f1$ and $f2$ being applied to the nonlinear element 10, and with a signal frequency $f_s$ also being applied to the nonlinear element 10, the tuning means 28 is adjusted to resonate at an idling frequency $f_i$ which is substantially equal to the sum of the source frequencies $f1$ and $f2$ minus the signal frequency $f_s$. Under these conditions, energy at the signal frequency $f_s$ will be amplified by the effective negative resistance presented by the nonlinear reactance element 10 to the signal energy. In other words, for the condition of amplification, the sum of the source frequencies $f1$ and $f2$ minus the idling frequency $f_i$ is equal to the signal frequency $f_s$. The amplified signal is derived at the signal output means 30 which is also coupled to the third waveguide 16.

As previously mentioned, the number of required sources of pumping frequency is one less than the order of the nonlinear reactance characteristic of the nonlinear element 10. Thus, the nonlinear element 10 in FIGURE 1 has a nonlinear reactance characteristic order of three. It will be appreciated that if the nonlinear order is made higher, then more sources at lower frequencies may be used. Theoretically, it is possible to obtain amplification with very low frequencies in the order of cycles if a nonlinear element having a sufficiently high order of nonlinear reactance can be obtained. If the nonlinear reactance characteristic of the element 10 is inductive, and if the frequency range is sufficiently high as to require the magnetic spin resonance to supply the nonlinear reactance characteristic, a direct current magnetic field can be applied to the element 10 in any convenient direction, such as shown by the arrow in FIGURE 1.

Figure 2:
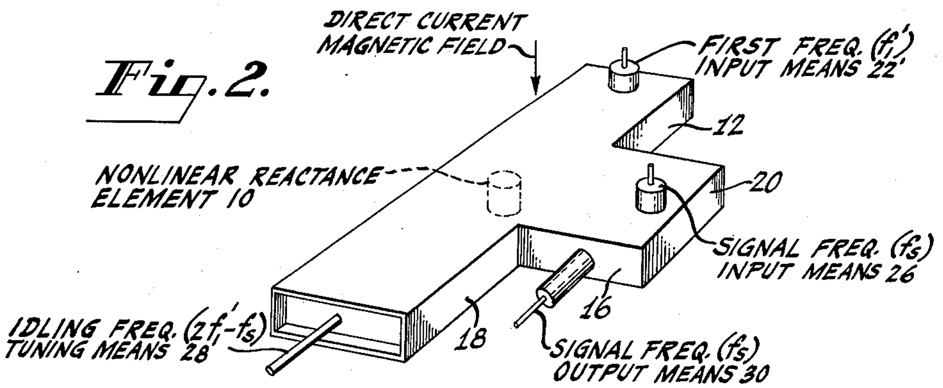
FIGURE 2 shows a modification of the amplifier shown in FIGURE 1, in which only one input means is provided for applying the external radio frequency energy.

FIGURE 2 shows a modification of the amplifier shown in FIGURE 1. The amplifier shown in FIGURE 2 is substantially identical to that shown in FIGURE 1 with one exception. If the source frequencies $f1$ and $f2$ are made equal to some source frequency $f1'$, then it is possible to eliminate the second waveguide 14 and its associated input means 24 and the external source of frequency $f2$. Thus, a more efficient amplifier is obtained. The idling frequency tuning means 28 is tuned so that the idling frequency in the idling waveguide 18 is equal to the sum of the effective source frequencies $f1'$ minus the signal frequency $f_s$. If the nonlinear reactance element 10 has a nonlinear characteristic order of three, then two effective sources are needed. However, only one external source supplying a frequency $f1'$ would be needed, and would be applied to the first input means 22. The idling frequency $f_i$ would then be equal to twice the source frequency $f1'$ less the signal frequency $f_s$. If the order of nonlinear characteristic is made sufficiently high, it is possible to reduce the source frequency to a relatively low value for amplifying a given signal frequency $f_s$. This can be mathematically expressed as follows: $f_i=(n-1)\ f1'-f_s$, where $n$ is the nonlinear order and is three or greater. If this expression is transposed, then $$f1'=\frac{f_i+f_s}{(n-1)}$$

Thus, if the order $n$ is increased, the required effective source frequency $f1'$ is decreased.

The amplifier shown and described in FIGURE 2 has been built and satisfactorily operated. The nonlinear reactance element 10 was made of a junction diode using germanium. The source frequency $f1'$ was 300 megacycles, and the signal frequency to be amplified was 380 megacycles. The third order of nonlinear characteristics of element 10 was utilized, hence the idling frequency tuning means 28 was tuned to a frequency of two times 300 megacycles less 380 megacycles, or 220 megacycles. With circuit Q's of 20, an input signal of a power level 40 db below 1 milliwatt was amplified by approximately a power gain of 25 db.

Figure 3:
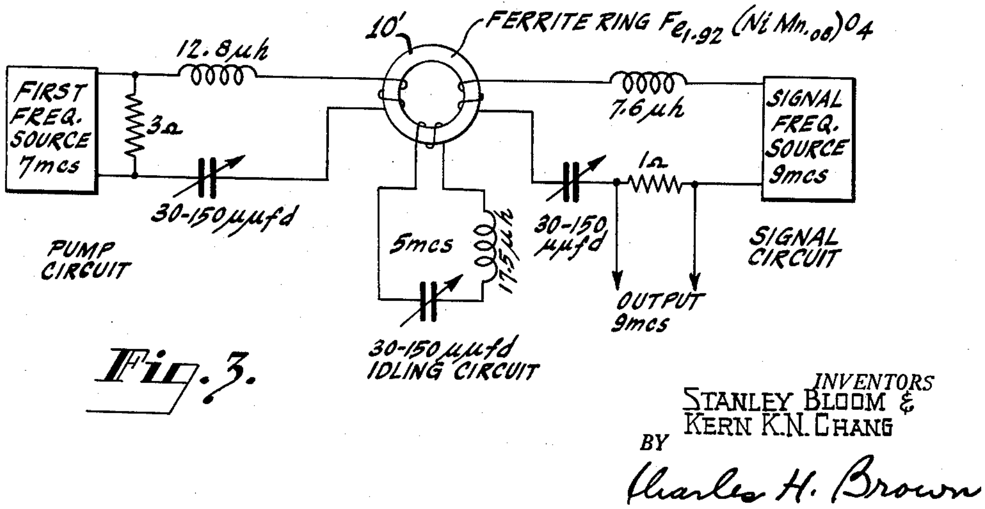
FIGURE 3 shows another embodiment of an amplifier in accordance with the invention that has only one input means for applying the external radio frequency energy.

FIGURE 3 shows another embodiment of an amplifier in accordance with the invention that has only one input means for applying the external radio frequency energy. The amplifier shown in FIGURE 3 is similar in operation to the amplifier shown in FIGURE 2. This amplifier has been built and satisfactorily operated using components and frequencies having the values indicated in FIGURE 3. The ferrite ring 10' was characterized by a low hysteresis loss, and had a third order nonlinear characteristic. The ferrite ring 10' had a thickness of approximately one-sixteenth inch, an outside diameter of approximately one-quarter inch, and an inside diameter of approximately one-eighth inch. The three windings shown each had two or three complete turns around the ferrite ring 10', and each had an inductance of approximately 0.28 microhenry ($\mu$h.). With circuit Q's of approximately 50, a 9 megacycle signal was amplified by approximately 30% with a pump power in the order of several watts. Since the amplifier shown in FIGURE 3 was operated at a relatively low frequency, namely 9 megacycles, the magnetization nonlinear reactance characteristic of the ferrite was used. However, if the ferrite ring 10' shown in FIGURE 3 were to be operated at considerably higher frequencies, say 300 megacycles, then the magnetic spin resonance would have to be used to provide the nonlinear reactance characteristic of the ferrite. In such a case, a direct current magnetic field would have to be applied to the ferrite to excite this magnetic spin resonance. The embodiment of FIGURE 3 can also be provided with another pump circuit which can be coupled to the ferrite ring through a fourth winding should two source frequency input means be desired. Theoretical research has revealed that larger gains should be obtainable by the utilization of higher circuit Q's and larger orders of nonlinearity. The circuit Q can be improved by using transmission line resonators. Such resonators would, in addition to providing more gain, raise the frequency range of the device to the UHF frequency band, or higher. FIGURES 1 and 2 are examples of such arrangements.

The arrangements shown in FIGURES 1, 2, and 3 are amplifiers, and have been described as such. However, each of the arrangements shown may serve as oscillators of radio frequency energy by eliminating the signal frequency input means, and by applying only the source frequencies.

What is claimed is:

1. An amplifying device comprising an element having a nonlinear reactance characteristic with an odd-order of nonlinearity greater than one, means for applying signal energy to be amplified to said element, means for applying to said element a plurality of signals each having a frequency lower than the frequency of said signal energy to be amplified, said element operating with an order of nonlinearity at least equal to the number of signals in said plurality of signals plus one, a single resonant circuit coupled to said element and tuned to a signal having an idling frequency equal to the sum of the frequencies of said plurality of signals minus the frequency of said signal energy, the interaction of said idling frequency signal and said plurality of signals across said element producing a negative resistance in the path of said signal energy, and means coupled to said element for deriving said signal energy amplified by the operation of said element.

2. An amplifying device comprising a ferrite ring having a nonlinear reactance characteristic with at least a third order of nonlinearity, a first winding coupled to said ring for applying a signal of a first frequency to be amplified to said ring, a second winding coupled to said ring for applying a second signal having a frequency lower than said first frequency to said ring, a third winding coupled to said ring, a single tuned circuit coupled to said third winding and tuned to a third signal having a frequency equal to twice the frequency of said second signal minus the frequency of said first signal, the interaction of said third and said second signals across said ring due to the nonlinear characteristic of said ring producing a negative resistance in the circuit of said first signal via said first winding, and output means coupled to said first winding for deriving an output signal having said first frequency but amplified as compared to said first signal.

3. An amplifying device comprising an element having a nonlinear reactance characteristic with at least a third order of nonlinearity, means for applying a signal of a first frequency to be amplified to said element, means for applying a second signal of a second frequency lower than said first frequency to said element, means for applying a third signal of a third frequency lower than said first frequency and different from said second frequency to said element, the sum of said second and third frequencies being higher than said first frequency, a single tuned resonant circuit coupled to said element and tuned to a fourth signal having a fourth frequency equal to the sum of said second and third frequencies minus said first frequency, the interaction of said fourth signal and the sum of said second and third signals across said element resulting in the production of a negative resistance in the path of said first signal, and output means coupled to said element for deriving from said element an output signal of said first frequency but amplified as compared to said first signal.

4. An amplifying device comprising an element having a nonlinear reactance characteristic with at least a third order of nonlinearity, means for applying a signal of a first frequency to be amplified to said element, means for applying a second signal of a second frequency lower than said first frequency to said element, said second frequency being higher than one-half said first frequency, a single resonant circuit coupled to said element and tuned to a third signal of a third frequency equal to at least twice said second frequency minus said first frequency, the interaction of said third signal and second signal at least doubled in frequency across said element resulting in the production of a negative resistance in the path of said first signal, and output means coupled to said element for deriving an output signal of said first frequency but amplified as compared to said first signal.

5. An amplifying device comprising first, second, third and fourth waveguides arranged to intersect, an element having a nonlinear reactance characteristic with at least a third order of nonlinearity positioned at the intersection of said waveguides so as to be coupled to each of the waveguides, means for causing a signal of a first frequency to be amplified to be applied to said element via said first waveguide, means for causing a second signal of a second frequency lower than said first frequency to be applied to said element via said second waveguide, means for causing a third signal of a third frequency lower than said first frequency and different from said second frequency to be applied to said element via said third waveguide, the sum of said second and third frequencies being higher than said first frequency, means for tuning said fourth waveguide to a fourth signal having a fourth frequency equal to the sum of said second and third frequencies minus said first frequency, the interaction of said fourth signal and the sum of said second and third signals across said element resulting in the production of a negative resistance in the path of said first signal applied to said element via said first waveguide, and output means coupled to said element via said first waveguide for deriving an output signal having said first frequency but amplified as compared to said first signal.

References Cited in the file of this patent

UNITED STATES PATENTS

| | | |
|---|---|---|
| 1,884,844 | Peterson | Oct. 25, 1932 |
| 1,884,845 | Peterson | Oct. 25, 1932 |
| 2,719,223 | Van der Ziel | Sept. 27, 1955 |
| 2,743,322 | Pierce et al. | Apr. 24, 1956 |
| 2,806,138 | Hopper | Sept. 10, 1957 |
| 2,815,488 | Von Neumann | Dec. 3, 1957 |
| 2,825,765 | Marie | Mar. 4, 1958 |
| 2,868,980 | Southworth | Jan. 13, 1959 |
| 2,897,452 | Southworth | July 28, 1959 |
| 2,909,654 | Bloembergen | Oct. 20, 1959 |

OTHER REFERENCES

Weiss: Physical Review, vol. 107, No. 1, July 1, 1957, page 317.

Landon: R.C.A. Review, vol. 10, No. 3, September 1949, pages 387–396.

Suhl: Journal of Applied Physics, vol. 28, No. 11, November 1957, pages 1225–1236.

Melchor et al.: "Proceedings of the IRE," May 19, 1957, pages 643–646.

Hogan et al.: "Journal of Applied Physics," March 1958, pages 422–423.

Suhl: "Physical Review," April 15, 1957, pages 384, 385.

Anderson: "Journal of Applied Physics," September 1957, pages 1049–1053.